(12) United States Patent
Arnold et al.

(10) Patent No.: US 11,585,004 B2
(45) Date of Patent: Feb. 21, 2023

(54) COMPOSITION FOR COBALT OR COBALT ALLOY ELECTROPLATING

(71) Applicant: BASF SE, Ludwigshafen am Rhein (DE)

(72) Inventors: Marco Arnold, Ludwigshafen (DE); Chiao Chien Wei, Taoyuan (TW); Tzu Tsang Huang, Taoyuan (TW); Shih Ming Lin, Taoyuan (TW); Cheng Chen Kuo, Taoyuan (TW); Shih Wei Chou, Taoyuan (TW); Chieh Chu, Taoyuan (TW)

(73) Assignee: BASF SE, Ludwigshafen am Rhein (DE)

( * ) Notice: Subject to any disclaimer, the term of this patent is extended or adjusted under 35 U.S.C. 154(b) by 92 days.

(21) Appl. No.: 17/047,500

(22) PCT Filed: Apr. 5, 2019

(86) PCT No.: PCT/EP2019/058617
§ 371 (c)(1),
(2) Date: Oct. 14, 2020

(87) PCT Pub. No.: WO2019/201623
PCT Pub. Date: Oct. 24, 2019

(65) Prior Publication Data
US 2021/0147994 A1 May 20, 2021

(30) Foreign Application Priority Data
Apr. 19, 2018 (EP) .................................... 18168249

(51) Int. Cl.
*C25D 3/18* (2006.01)
*C25D 3/16* (2006.01)
*C25D 7/12* (2006.01)
*H01L 23/00* (2006.01)

(52) U.S. Cl.
CPC ............... *C25D 3/18* (2013.01); *C25D 3/16* (2013.01); *C25D 7/123* (2013.01); *H01L 24/03* (2013.01); *H01L 24/05* (2013.01); *H01L 2224/03462* (2013.01); *H01L 2224/0401* (2013.01); *H01L 2224/05157* (2013.01)

(58) Field of Classification Search
None
See application file for complete search history.

(56) References Cited

U.S. PATENT DOCUMENTS

| | | | |
|---|---|---|---|
| 2,644,787 A * | 7/1953 | Wendell, Jr. ............ | H01F 41/26 428/936 |
| 3,274,079 A * | 9/1966 | Passal .................... | C25D 3/562 205/255 |
| 3,951,760 A | 4/1976 | Fueki et al. | |
| 4,016,051 A | 4/1977 | Geldzahler et al. | |
| 4,425,198 A | 1/1984 | Martin | |
| 4,435,254 A * | 3/1984 | Lemke ..................... | C25D 3/16 205/279 |
| 6,372,118 B1 * | 4/2002 | Hui ........................ | C25D 3/562 205/255 |
| 2011/0163449 A1 | 7/2011 | Kelly et al. | |
| 2014/0183738 A1 | 7/2014 | Jezewski et al. | |
| 2016/0273117 A1 | 9/2016 | Doubina et al. | |
| 2019/0226107 A1 | 7/2019 | Kienle et al. | |
| 2020/0040478 A1 * | 2/2020 | Commander ........... | C25D 7/123 |

FOREIGN PATENT DOCUMENTS

| | | |
|---|---|---|
| DE | 10 2014 019 753 A1 | 6/2016 |
| GB | 1 336 146 A | 11/1973 |
| GB | 2 100 752 A | 1/1983 |
| JP | 62-103387 A | 5/1987 |
| WO | WO 2017/004424 A1 | 1/2017 |
| WO | WO 2018/015168 A1 | 1/2018 |

OTHER PUBLICATIONS

International Search Report dated Nov. 14, 2019 in PCT Patent Application No. PCT/EP2019/058617, citing documents AA, AB, AE, AJ, AK, AM, AN, AU-AX therein, 6 pages.
European Search Report dated Jan. 18, 2019 in European Patent Application No. 18168249.3, citing documents AA, AB, AE, AJ, AK, AM, AN, AU-AX therein, 5 pages.
International Preliminary Report on Patentability and Written Opinion dated Oct. 20, 2020 in PCT/EP2019/058617 (English Translation only), citing documents AA and AK, 10 pages.
Buckalew, et al., "Electrodeposited Cobalt for Advanced Packaging Applications", Electron Devices Technology and Manufacturing Conference (EDTM), IEEE, Feb. 28-Mar. 2, 2017, pp. 51-52.
Ewing, et al., "High-current-density Electrodeposition Using Pulsed and Constant Currents to Produce Thick CoPt Magnetic Films on Silicon Substrates", AIP Advances, vol. 8, Issue 5, Dec. 20, 2017, 6 pages.
Neri, et al., "Cobalt Electrodeposition Process from Electrolytic Baths based on $CoSO_4$ and $(NH_4)_2SO4$. Influence of [Co(II)]", ECS Transactions, vol. 20, Issue 1, 2009, pp. 375-383.
Soto, et al., "Electrochemical Nucleation of Cobalt Onto Glassy Carbon Electrode From Ammonium Chloride Solutions", Electrochimica Acta, vol. 41, Issue 16, 1996, pp. 2647-2655.
Lee, et al.. "Superconformal Electrodeposition of Co and Co—Fe Alloys Using 2-Mercapto-5-benzimidazolesulfonic Acid", Journal of the Electrochemical Society, vol. 156, Issue 8, Jun. 10, 2009, pp. D301-D309.

* cited by examiner

*Primary Examiner* — Louis J Rufo
(74) *Attorney, Agent, or Firm* — Armstrong Teasdale LLP

(57) ABSTRACT

A cobalt electroplating composition may include (a) cobalt ions; and (b) an ammonium compound of formula $(NR^1R^2R^3H^+)_n X^{n-}$, wherein $R^1$, $R^2$, $R^3$ are independently H or linear or branched $C_1$ to $C_6$ alkyl, X is one or more n valent inorganic or organic counter ion(s), and n is an integer from 1, 2, or 3.

18 Claims, No Drawings

COMPOSITION FOR COBALT OR COBALT ALLOY ELECTROPLATING

The present invention relates to a composition for cobalt or cobalt alloy electroplating.

BACKGROUND OF THE INVENTION

Filling of small features, such as vias and trenches, by metal electroplating is an essential part of the semiconductor manufacture process. It is well known, that the presence of organic substances as additives in the electroplating bath can be crucial in achieving a uniform metal deposit on a substrate surface and in avoiding defects, such as voids and seams, within the metal lines.

With further decreasing aperture size of recessed features like vias or trenches the filling of the interconnects with copper becomes especially challenging, also since the copper seed deposition by physical vapor deposition (PVD) prior to the copper electrodeposition might exhibit inhomogeneity and non-conformity and thus further decreases the aperture sizes particularly at the top of the apertures. Furthermore, it becomes more and more interesting to substitute copper by cobalt since cobalt shows less electromigration into the dielectric.

WO 2017/004424 discloses a composition for cobalt electroplating into interconnect features comprising an acetylenic suppressor compound and preferably a buffer. A preferred buffer is boric acid. The only example comprises boric acid, too.

DE 10 2014 019753 A1 discloses a boric acid free nickel electroplating bath comprising ammonium chloride.

JP 62-103387 A discloses an electroplating bath for depositing metals like Ni, Co, Fe, etc. which comprises a buffer. The Co composition in example 10 comprises citrate as the buffer.

On the other hand, cobalt may also be a substitute of copper in other applications like under bump metallization. In this case much bigger structures comprising micrometer-sized aperture size are used. Besides a void free filling in this application it is of particular importance that all features are equally filled with cobalt so that all bump on which the solders are to be deposited show essentially the same height.

A disadvantage of the existing cobalt electrodeposition baths is the pronounced non-uniformity of the electrodeposited cobalt layer.

There is still a strong need for a cobalt electroplating bath which provides, besides void-free filling of submicrometer-sized interconnects, a substantially planar surface over the filled features. There is also a strong need for a cobalt electroplating bath which provides a cobalt under bump metallization showing a low non-uniformity over the filled features.

It is therefore an object of the present invention to provide a composition useful for cobalt electrodeposition which improves the non-uniformity of the cobalt deposit across the wafer.

SUMMARY OF THE INVENTION

It was found that it is possible to reduce the non-uniformity in cobalt electroplating compositions by using particular ammonium compounds as described below, particularly if applied to substrates comprising micrometer-sized solder bump features.

Therefore, the present invention provides a composition comprising
(a) cobalt ions,
(b) an ammonium compound of formula $(NR^1R^2R^3H^+)_n X^{n-}$
wherein
$R^1$, $R^2$, $R^3$ are independently selected from H and linear or branched $C_1$ to $C_6$ alkyl,
X is selected from an n valent inorganic or organic counter ion,
n is an integer selected from 1, 2 or 3.

The invention further relates to the use of a metal plating composition as defined herein for depositing cobalt into interconnect features or for providing a cobalt under bump metallization.

The invention further relates to a process for depositing a layer comprising cobalt on a substrate comprising features having an aperture size of 1 nanometer to 100 micrometers, by
a) contacting a composition as defined herein with the substrate, and
b) applying a current density to the substrate for a time sufficient to deposit a metal layer onto the substrate.

By using the ammonium compound according to the invention, the non-uniformity of the cobalt deposit across the wafer is significantly improved. A further advantage of the present invention is that by using the ammonium compounds described herein avoids the use of boric acid, which is a big advantage for health, safety and environmental reasons. Therefore, a further object of the present invention to provide a composition useful for cobalt electrodeposition which is boric acid free.

DETAILED DESCRIPTION OF THE INVENTION

The compositions according to the inventions comprise cobalt ions, and an ammonium compound as described below.

Ammonium Compound

The cobalt or cobalt alloy electroplating composition comprises an ammonium compound of formula $(NR^1R^2R^3H^+)_n X^{n-}$.

Herein, $R^1$, $R^2$, and $R^3$ are independently selected from H, linear or branched $C_1$ to $C_6$ alkyl. Preferably, $R^1$, $R^2$, and $R^3$ are independently selected from H and a linear or branched $C_1$ to $C_4$ alkyl, particularly methyl and ethyl. More preferably at least one of $R^1$, $R^2$ and $R^3$ is H, even more preferably at least two of $R^1$, $R^2$ and $R^3$ are H. Most preferably, $R^1$, $R^2$, and $R^3$ are H.

X is an n valent inorganic or organic counter ion. Typical inorganic counter-ions are, without limitation, chloride, sulfate (including hydrogen sulfate), phosphate (including hydrogen and dihydrogen phosphate), and nitrate. Typical organic counter-ions are, without limitation, $C_1$ to $C_6$ alkyl sulfonate, preferably methane sulfonate, $C_1$ to $C_6$ carboxylates, preferably acetate or citrate, phosponate, sulfamate, etc. Inorganic counter-ions are preferred. Chloride is the most preferred counter ions X since by using chloride in combination with the ammonium cation the non-uniformity of the cobalt deposit across the wafer may be further improved.

n is an integer selected from 1, 2 or 3 depending on the valence of the counter-ion. By way of example, for chloride and hydrogen sulfate n would be 1, for sulfate or hydrogen phosphate n would be 2 and for phosphate n would be 3.

Preferred ammonium compounds are ammonium sulfate, ammonium chloride, or ammonium methane sulfonate, Depending on the pH of the composition the amine compound may be completely or partly protonated or deprotonated.

Preferably the cobalt or cobalt alloy electroplating composition is essentially free of boric acid. Essentially free of boric acid as used herein means a boric acid content below 0.1 g/l, preferably below 100 ppm by mass, most preferably the content of boric acid is below the detection limit.

Suppressing Agents

The plating composition may further comprise one or more suppressing agents (also referred to as suppressors).

Without limitation, typical suppressing agents are selected from the group consisting of: carboxymethylcellulose, nonylphenolpolyglycol ether, polyethylene glycoldimethyl ether, octandiolbis(polyalkylene glycol ether), octanol polyalkylene glycol ether, oleic acid polyglycol ester, polyethylene propylene glycol, polyethylene glycol, polyethyleneimine, polyethylene glycoldimethyl ether, polyoxypropylene glycol, polypropylene glycol, polyvinyl alcohol, stearic acid polyglycol ester, stearyl alcohol polyglycol ether, polyethylene oxide, ethylene oxide-propylene oxide copolymers, butyl alcohol-ethylene oxide-propylene oxide copolymers, 2-Mercapto-5-benzimidazolesulfonic acid, 2-mercaptobenzimidazole (MBI), benzotriazole, and combinations thereof.

In some embodiments, the suppressor includes one or more nitrogen atoms such as an amine group or an imine group. In some embodiments, the suppressor is a polymeric or oligomeric compound containing amine groups separated by a carbon aliphatic spacer such as $CH_2CH_2$ or $CH_2CH_2CH_2$. In a particular embodiment, the suppressor is polyethyleneimine (PEI, also known as polyaziridine, poly[imino(1,2-ethanediyl)], or poly(iminoethylene)). PEI has shown very good bottom-up fill characteristics in the context of cobalt deposition, as shown in the experimental results included herein.

Particularly preferred suppressing agents are those of formula I

(S1)

to fill aperture sizes having nanometer or micrometer scale, in particular aperture sizes having 100 nanometers or less, 20 nm or less, 15 nm or less or even 7 nm or less.

Herein, $R^1$ is selected from X—Y, wherein X is a divalent spacer group selected from linear or branched $C_1$ to $C_{10}$ alkanediyl, linear or branched $C_2$ to $C_{10}$ alkenediyl, linear or branched $C_2$ to $C_{10}$ alkynediyl, and $(C_2H_3R^6—O)_m$—. m is an integer selected from 1 to 30, preferably from 1 to 15, even more preferably from 1 to 10, most preferably from 1 to 5.

In a preferred embodiment X is selected from linear or branched $C_1$ to $C_6$ alkanediyl, preferably from $C_1$ to $C_4$ alkanediyl.

In a preferred embodiment X is selected from methanediyl, ethane-1,1-diyl and ethane-1,2-diyl. In a second preferred embodiment X is selected from propan-1,1-diyl, butane-1,1-diyl, pentane-1,1-diyl, and hexane-1,1-diyl. In a third preferred embodiment X is elected from propane-2,2-diyl, butane-2,2-diyl, pentane-2,2-diyl, and hexane-2,2-diyl.

In a fourth preferred embodiment X is elected from propane-1,2-diyl, butane-1,2-diyl, pentane-1,2-diyl, and hexane-1,2-diyl. In a fifth preferred embodiment X is elected from propane-1-3-diyl, butane-1,3-diyl, pentane-1,3-diyl, and hexane-1,3-diyl.

Y is a monovalent group and may be selected from $OR^3$, with $R^3$ being selected from (i) H, (ii) $C_5$ to $C_{20}$ aryl, preferably $C_5$, $C_6$, and $C_{10}$ aryl, (iii) $C_1$ to $C_{10}$ alkyl, preferably $C_1$ to $C_6$ alkyl, most preferably $C_1$ to $C_4$ alkyl (iv) $C_6$ to $C_{20}$ arylalkyl, preferably $C_6$ to $C_{10}$ arylalkyl, (v) $C_6$ to $C_{20}$ alkylaryl, all of which may be substituted by OH, $SO_3H$, COOH or a combination thereof, and (vi) $(C_2H_3R^6—O)_n$—H. In a preferred embodiment, $R^3$ may be $C_1$ to $C_6$ alkyl or H. $R^6$ may be selected from H and $C_1$ to $C_5$ alkyl, preferably from H and $C_1$ to $C_4$ alkyl, most preferably H, methyl or ethyl.

In another preferred embodiment, $R^3$ is selected from H to form a hydroxy group. In another preferred embodiment, $R^3$ is selected from polyoxyalkylene groups of formula $(C_2H_3R^6—O)_n$—H. $R^6$ is selected from H and $C_1$ to $C_5$ alkyl, preferably from H and $C_1$ to $C_4$ alkyl, most preferably from H, methyl or ethyl. Generally, n may be an integer from 1 to 30, preferably from 1 to 15, most preferably from 1 to 10. In a particular embodiment polyoxymethylene, polyoxypropylene or a polyoxymethylene-co-oxypropylene may be used. In another preferred embodiment, $R^3$ may be selected from $C_1$ to $C_{10}$ alkyl, preferably from $C_1$ to $C_6$ alkyl, most preferably methyl and ethyl.

Furthermore, Y may be an amine group $NR^3R^4$, wherein $R^3$ and $R^4$ are the same or different and may have the meanings of $R^3$ described for $OR^3$ above.

In a preferred embodiment, $R^3$ and $R^4$ are selected from H to form an $NH_2$ group. In another preferred embodiment, at least one of $R^3$ and $R^4$, preferably both are selected from polyoxyalkylene groups of formula $(C_2H_3R^6—O)_n$—H. $R^6$ is selected from H and $C_1$ to $C_5$ alkyl, preferably from H and $C_1$ to $C_4$ alkyl, most preferably H, methyl or ethyl. In yet another preferred embodiment, at least one of $R^3$ and $R^4$, preferably both are selected from $C_1$ to $C_{10}$ alkyl, preferably from $C_1$ to $C_6$ alkyl, most preferably methyl and ethyl.

$R^3$ and $R^4$ may also together form a ring system. which may be interrupted by O or $NR^7$. $R^7$ may be selected from $R^6$ and

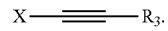

Such ring system may preferably comprise 4 or 5 carbon atoms to form a 5 or 6 membered carbocyclic system. In such carbocyclic system one or two of the carbon atoms may be substituted by oxygen atoms.

Furthermore, Y may be a positively charged ammonium group $N^+R^3R^4$, $R^5$. $R^3$, $R^4$, $R^5$ are the same or different and may have the meanings of $R^3$ described for $OR^3$ and $NR^3R^4$ above. In a preferred embodiment $R^3$, $R^4$ and $R^5$ are independently selected from H, methyl or ethyl. m may be an integer selected from 1 to 30, preferably from 1 to 15, even more preferably from 1 to 10, most preferably from 1 to 5.

In the additives of formula S1 $R^2$ may be either $R^1$ or $R^3$ as described above. If $R^2$ is $R^1$, $R^1$ may be selected to form a symmetric compound (both $R^1$s are the same) or an asymmetric compound (the two $R^1$s are different).

In a preferred embodiment $R^2$ is H.

Particularly preferred aminoalkynes are those in which
(a) $R^1$ is X—$NR^3R^4$ and $R^2$ is H;
(b) $R^1$ is X—$NR^3R^4$ and $R^2$ is X—$NR^3R^4$ with X being selected from linear $C_1$ to $C_4$ alkanediyl and branched $C_3$ to $C_6$ alkanediyl;

Particularly preferred hydroxyalkynes or alkoxyalkynes are those in which (a) $R^1$ is X—$OR^3$ and $R^2$ is H;
(b) $R^1$ is X—$OR^3$ and $R^2$ is X—$OR^3$ with X being selected from linear $C_1$ to $C_4$ alkanediyl and branched $C_3$ to $C_6$ alkanediyl;

Particularly preferred alkynes comprising an amino and a hydroxy group are those in which $R^1$ is X—$OR^3$, particularly X—OH, and $R^2$ is X—$NR^3R^4$ with X being independently selected from linear $C_1$ to $C_4$ alkanediyl and branched $C_3$ to $C_6$ alkanediyl;

The amine groups in the additives may be selected from primary ($R^3$, $R^4$ is H), secondary ($R^3$ or $R^4$ is H) and tertiary amine groups ($R^3$ and $R^4$ are both not H).

The alkynes may comprise one or more terminal triple bonds or one or more non-terminal triple bonds (alkyne functionalities). Preferably, the alkynes comprise one or more terminal triple bonds, particularly from 1 to 3 triple bonds, most preferably one terminal triple bond.

Particularly preferred specific primary aminoalkynes are:

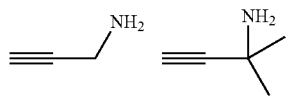

Particularly preferred specific secondary aminoalkynes are:

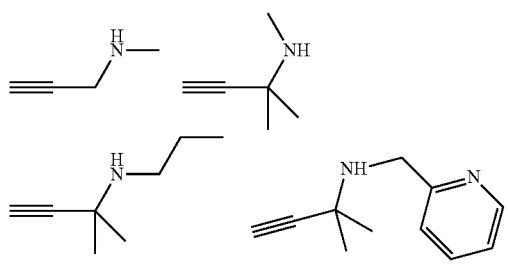

Particularly preferred specific tertiary aminoalkynes are:

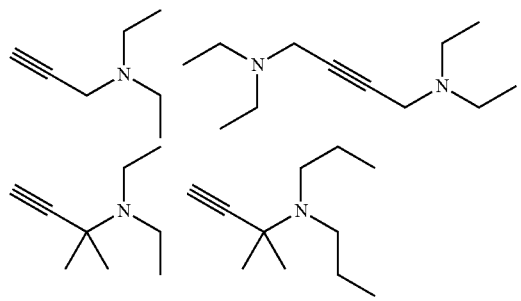

Other preferred additives are those in which the rests $R^3$ and $R^4$ may together form a ring system, which is optionally interrupted by O or $NR^3$. Preferably, the rests $R^3$ and $R^4$ together form a $C_5$ or $C_6$ bivalent group in which one or two, preferably one, carbon atoms may be exchanged by O or $NR^7$, with $R^7$ being selected from hydrogen, methyl or ethyl.

An example of such compounds is:

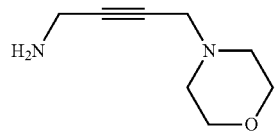 [SMILES: NCC#CCN1CCOCC1]

The first one may be received by reaction of propargyl amine with formaldehyde and morpholine, the second and third ones by reaction of propargyl alcohol with formaldehyde and piperidine or morpholine, respectively.

Another preferred additive comprising a saturated heterocyclic system is:

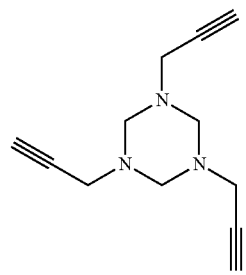

In this case $R^3$ and $R^4$ together form a ring system which is interrupted by two $NR^3$ groups, in which $R^3$ is selected from $CH_2$—C≡C—H. This additive comprises three terminal triple bonds.

The amino groups in the additives may further be quaternized by reaction with alkylating agents such as but not limited to dialkyl sulphates like DMS, DES or DPS, benzyl chloride or chlormethylpyridine. Particularly preferred quaternized additives are:

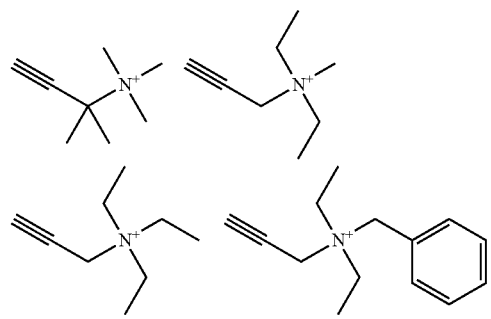

Particularly preferred specific pure hydroxyalkynes are:

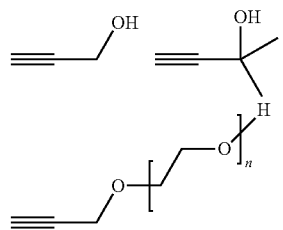

Particularly preferred specific aminoalkynes comprising OH groups are:

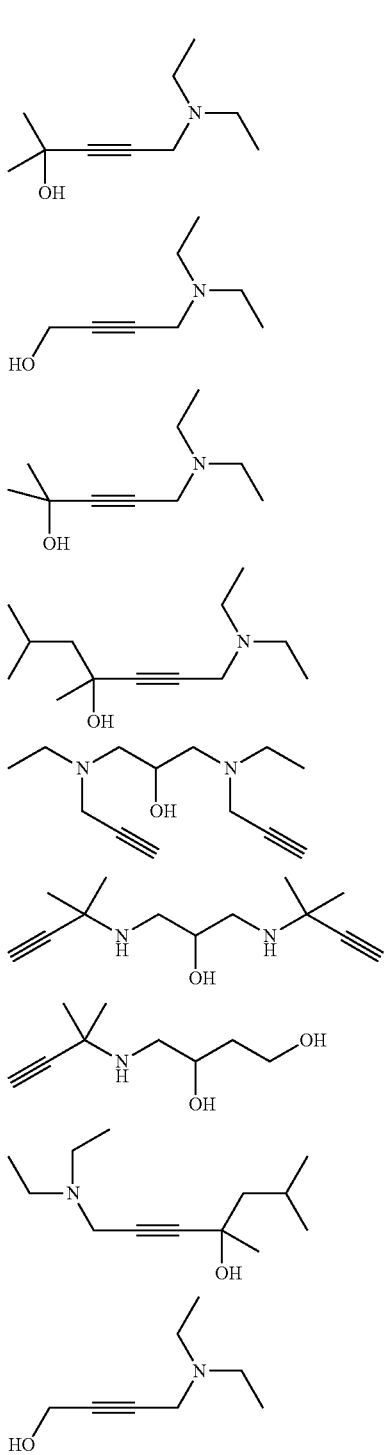

Also in this case the rests $R^3$ and $R^4$ may together form a ring system, which is optionally interrupted by O or $NR^3$. Preferably, the rests $R^3$ and $R^4$ together form a $C_5$ or $C_6$ bivalent group in which one or two, preferably one, carbon atoms may be exchanged by O or $NR^7$, with $R^7$ being selected from hydrogen, methyl or ethyl.

Examples for such compounds are:

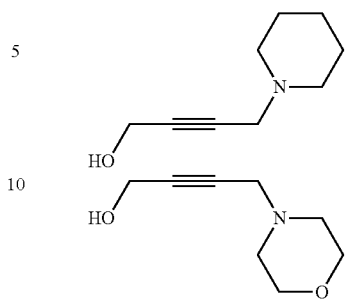

These may be received by reaction of propargyl alcohol with formaldehyde and piperidine or morpholine, respectively.

By partial reaction with alkylating agents mixtures of additives may be formed. In one embodiment, such mixtures may be received by reaction of 1 mole diethylaminopropyne and 0.5 mole epichlorohydrin, 1 mole diethylaminopropyne and 0.5 mole benzylchloride, 1 mole diethylaminopropyne with 0.9 mole dimethyl sulphate, 1 mole dimethyl propyne amine and 0.33 mole dimethyl sulphate, or 1 mole dimethyl propyne amine and 0.66 mole dimethyl sulphate. In another embodiment such mixtures may be received by reaction of 1 mole dimethyl propyne amine and 1.5, 1.9, or 2.85 mole dimethyl sulphate, 1 mole dimethyl propyne amine and 0.5 mole epichlorohydrin, 1 mole dimethyl propyne amine and 2.85 diethyl sulphate, or 1 mole dimethyl propyne amine and 1.9 mole dipropyl sulphate.

In a further embodiment, the suppressing agents may be substituted by $SO_3H$ (sulfonate) groups or COOH (carboxy) groups. Specific sulfonated additives may be but are not limited to butynoxy ethane sulfonic acid, propynoxy ethane sulfonic acid, 1,4-di-(β-sulfoethoxy)-2-butyne, 3-(β-sulfoethoxy)-propyne.

In general, the total amount of the suppressing agents in the electroplating bath is from 0.5 ppm to 10000 ppm based on the total weight of the plating bath. The suppressing agents are typically used in a total amount of from about 0.1 ppm to about 1000 ppm based on the total weight of the plating bath and more typically from 1 to 100 ppm, although greater or lesser amounts may be used. Preferred concentration ranges are for example between about 10-60 ppm, or between about 15-60 ppm, or between about 30-60 ppm. In this context, parts per million (ppm) is a mass fraction of the suppressor molecules in the electrolyte. In some cases, the suppressor may have a concentration of at least about 10 ppm, or at least about 15 ppm, or at least about 20 ppm, or at least about 30 ppm, or at least about 50 ppm. In these or other cases, the suppressor may have a concentration of about 1,000 ppm or less, for example about 500 ppm or less, about 100 ppm or less, about 75 ppm or less, about 60 ppm or less, or about 50 ppm or less.

Leveling Agents

The plating composition may further comprise one or more leveling agents.

Preferred levelers are those of formula L1 to L4

-continued

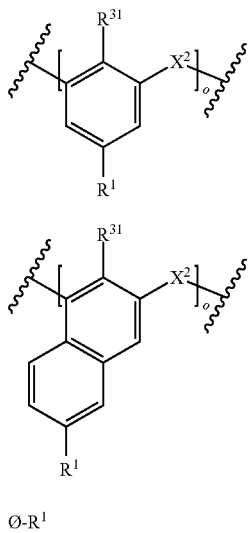

with the substituents described below.

As used herein, "aryl" means a $C_6$ to $C_{14}$ carbocyclic or a $C_3$ to $C_{10}$ nitrogen or oxygen containing heterocyclic aromatic ring system, which may be unsubstituted or substituted by up to three $C_1$ to $C_{12}$ alkyl groups or up to two $OH$, $NH_2$ or $NO_2$ groups.

In all embodiments, $R^1$ in formulas L1 to L4 may be selected from $X^1$—CO—O—$R^{11}$, $X^1$—$SO_2$—O—$R^{11}$, $X^1$—PO($OR^{11}$)$_2$, and $X^1$—SO—$OR^{11}$. $R^1$ is also referred to herein as "functional group". $X^1$ may be a chemical bond, which means that the functional groups —CO—O—$R^{11}$, —$SO_2$—O—$R^{11}$, —PO($OR^{11}$)$_2$ and —SO—$OR^{11}$ are directly boned to the polymer backbone in formula L1, the vinyl group in formula L2 or the aromatic system in formulas L3a, L3b, and L4. As used herein, "chemical bond" means that the respective moiety is not present but that the adjacent moieties are bridged so as to form a direct chemical bond between these adjacent moieties. By way of example, if in X—Y—Z the moiety Y is a chemical bond then the adjacent moieties X and Z together form a group X—Z.

In an alternative $X^1$ is a divalent aryl group. Preferred divalent aryl groups are phenylene, naphthalene, pyridine, or imidazole, particularly 1, 4 phenylene.

In a further alternative $X^1$ is a divalent $C_1$ to $C_{12}$ alkanediyl group, which may be interrupted by O atoms. As used herein, "$C_x$" means that the respective group comprises x numbers of C atoms. By way of example, the terms "$C_x$ to $C_y$ alkanediyl" and $C_x$ to $C_y$ alkyl mean alk(anedi)yl with a number x to y of carbon atoms and includes linear, branched (if >$C_3$) and cyclic alkanediyl (if >$C_4$).

In yet a further alternative $X^1$ is a divalent arylalkyl group —$X^{11}$—$X^{12}$—, wherein $X^{11}$ is a $C_1$ to $C_{15}$ alkandiyl group bonded to the polymer backbone, vinyl group, or aromatic system, respectively, and $X^{12}$ is a divalent aryl group bonded to the functional group. Preferred arylalkyl groups may be but are not limited to benzyl (ortho, meta or para form) and 1, 2, or 3-methylpyridine. Preferably the alkanediyl part $X^{11}$ may be methanediyl, propanediyl, or butanediyl. Preferably the aryl part $X^{12}$ may be phenylene, naphthalene, pyridine, or imidazole, particularly 1,4 phenylene.

In another alternative $X^1$ is a divalent alkylaryl group —$X^{12}$—$X^{11}$—, wherein $X^{12}$ is a divalent aryl group bonded to the polymer backbone, vinyl group, or aromatic system, respectively, and $X^{11}$ is a $C_1$ to $C_{15}$ alkandiyl group bonded to the functional group. Preferred arylalkyl groups may be but are not limited to toluyl (ortho, meta or para form) and 1, 2, or 3-methylpyridine. Preferably the alkanediyl part $X^{11}$ may be methanediyl, propanediyl, or butanediyl. Preferably the alkanediyl part $X^{11}$ may be phenylene, naphthalene, pyridine, or imidazole, particularly 1,4 phenylene.

In yet another alternative $X^1$ is a divalent (poly)alkylene oxide spacer —$(C_2H_3R^{12}$—O)$_m$—, wherein $R^{12}$ is selected from H and $C_1$ to $C_4$ alkyl, preferably H or methyl, and m is an integer from 1 to 10, preferably from 1 to 5.

Preferably, $X^1$ is selected from a chemical bond, $C_1$ to $C_4$ alkandiyl, or phenylene.

In a preferred embodiment $R^{11}$ is selected from H and $C_1$ to $C_4$ alkyl, preferably H or methyl, most preferably H.

In the first embodiment, in formula L1 is a co-monomeric unit derived from vinyl alcohol, which may optionally be (poly)ethyoxylated, or acrylamide, and B is a monomeric unit of formula L1a

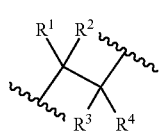

(L1a)

In formulas L1a and L2 of the first and the second embodiment, $R^2$ is selected from
(i) H,
(ii) aryl, preferably a $C_6$ to $C_{10}$ carbocyclic aryl or a $C_3$ to $C_8$ heterocyclic aryl comprising up to two N atoms, most preferably phenyl or pyridyl,
(iii) $C_1$ to $C_{10}$ alkyl, preferably $C_1$ to $C_6$ alkyl, more preferably $C_1$ to $C_4$ alkyl, most preferably $C_1$ to $C_3$ alkyl,
(iv) arylalkyl, preferably a $C_7$ to $C_{15}$ carbocyclic arylalkyl or a $C_4$ to $C_8$ heterocyclic arylalkyl comprising up to two N atoms, more preferably $C_4$ to $C_8$ arylalkyl, most preferably benzyl or 1, 2, or 3-methylpyridine,
(v) alkylaryl, preferably a $C_7$ to $C_{15}$ carbocyclic alkylaryl or a $C_4$ to $C_8$ heterocyclic alkylaryl comprising up to two N atoms, more preferably $C_4$ to $C_8$ alkylaryl, most preferably toluyl (otho, meta or para form) and 1, 2, or 3-methylpyridine, or
(vi) a (poly)alkylene oxide substituent —(O—$C_2H_3$ $R^{12}$)$_m$—OH, with m being an integer from 1 to 50, preferably 1 to 30, more preferably 1 or 2 to 20, most preferably 1 or 2 to 10, and $R^{12}$.

In formulas L1a and L2, $R^3$ is selected from $R^1$ and $R^2$. $R^4$ is selected from $R^2$ and, only in case $R^3$ is not $R^1$, $R^3$ may also be $R^1$. In other words: The formulas L1a and L2 may comprise one or two functional groups $R^1$. As a consequence, the levelers of L2 with two functional groups may have cis and trans configuration with respect to functional group $R^1$.

In a preferred embodiment, $R^2$, $R^3$ and $R^4$ are selected from H, methyl, ethyl, or propyl, most preferably H. In another preferred embodiment, $R^2$ and either $R^3$ or $R^4$ are selected from H, methyl, ethyl, or propyl, most preferably H and the other group $R^3$ or $R^4$ is selected from $R^1$.

In formula L1, n is an integer from 2 to 10,000 and p may either be 0 or an integer from 1 to 10,000.

If p is 0, the levelers of formula L1 may be homopolymers, such as but not limited to polyacrylic acid, polysulfonic acid, polyphosphonic acid and the like, in which $R^2$=$R^3$=$R^4$=H, or polymaleic acid, in which $R^2$=$R^4$=H and $R^3$=$R^1$ or $R^2$=$R^3$=H and $R^4$=$R^1$. Alternatively, the levelers of formula L1 may be co-polymers, such as but not limited to poly(acrylic acid-co-maleic acid), poly(acrylic acid-co-2-methylacrylic acid), poly(sulfonic acid-co-maleic acid), poly(phosphonic acid-co-maleic acid), and the like, in order to tune the amount of functional groups present in the leveler. Alternatively, if p>0, the polymeric levelers may be co-polymers of the monomers mentioned above with further monomers like vinyl alcohol and its ethoxylated or polyethoxylated derivatives or acrylamide. In this case the sum of n and p is the overall degree of polymerization.

The degree of polymerization n+p in formula L1 is an integer from 2 to 10,000. Preferably n+p is an integer from 10 to 5000, most preferably from 20 to 5000.

If copolymers are used, such copolymers may have block, random, alternating or gradient, preferably random structure. As used herein, "random" means that the respective co-monomers are polymerized from a mixture and therefore arranged in a statistically manner depending on their copolymerization parameters. As used herein, "block" means that the respective co-monomers are polymerized after each other to form blocks of the respective co-monomers in any predefined order.

The molecular weight $M_w$ of the polymeric levelers of formula L1 may be from about 500 to about 500000 g/mol, preferably from about 1000 to about 350000 g/mol, most preferably from about 2000 to about 300000 g/mol. In one particular embodiment the molecular weight $M_w$ is from about 1500 to about 10000 g/mol. In another embodiment the molecular weight $M_w$ is from about 15000 to about 50000 g/mol. In yet another embodiment the molecular weight Mw is from about 100000 to about 300000 g/mol.

If co-polymers are used, the ratio between two monomers B or the comonomers A and the monomers B in the levelers of formula L1 may be from 5:95 to 95:5% by weight, preferably from 10:90 to 90:10 by weight, most preferably from 20 80 to 80:40 by weight. Also terpolymers comprising two monomers B and a comonomer A may be used.

Particularly preferred polymeric levelers of formula L1 are polyacrylic acid, a maleic acid acrylic acid copolymer, an acrylic acid 2-methylacrylic acid copolymer, polyphosphonic acid, and polysulfonic acid. Most preferred are polyacrylic acid, a maleic acid acrylic acid copolymer and an acrylic acid 2-methylacrylic acid copolymer. In case of a maleic acid acrylic acid copolymer a ratio p:n of 20 80 to 60:40 is particularly preferred. In case of a 2-methylacrylic acid acrylic acid copolymer a ratio p:n of 20 80 to 80:20 is particularly preferred.

The following specific copolymer levelers of formulas L1b to L1d are particularly preferred:

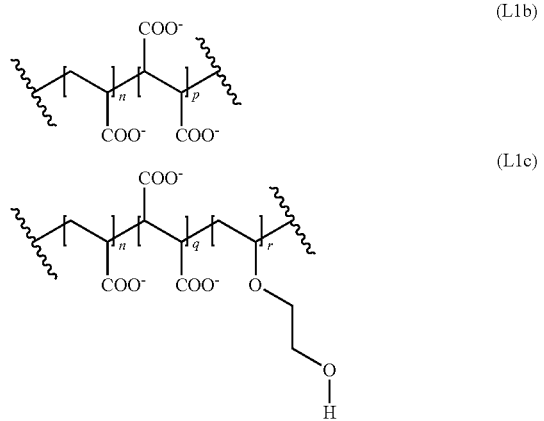

which is a terpolymer of acrylic acid, maleic acid and ethyoxylated vinyl alcohol, wherein q and r are integers, the sum q+r corresponds to p in formula 1 and the ratio q/r is from 10:90 to 90:10, preferably 20:80 to 80:40, most preferably from 40:60 to 60:40; and

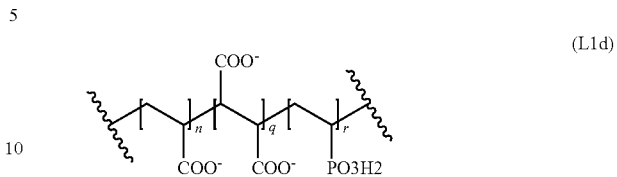

which is a terpolymer of acrylic acid, maleic acid and vinylphosponic acid, wherein q and r are integers, the sum q+r corresponds to p in formula 1 and the ratio q/r is from 10:90 to 90:10, preferably 20:80 to 80:40, most preferably from 40:60 to 60:40.

Particularly preferred monomeric levelers of formula L2 are acrylic acid, vinylphosphonic acid, and vinylsulfonic acid.

In the third embodiment comprising a polymeric leveling agent of formula L3a or L3b (together also referred to as L3) $R^{31}$ may generally be $R^1$, H, $OR^5$ and $R^5$ as defined above. Preferably, $R^{31}$ is H or OH. Such polymers are available in the market under Napthalene sulphonic acid condensation product, Na-salt and Phenol sulfonic acid condensation product, Na-salt, e.g. from BASF.

In the levelers of formula L3 $X^2$ is (i) a chemical bond or (ii) methanediyl. Preferably $X^2$ is methanediyl.

The degree of polymerization o in the levelers of formula L3 is from 2 to 1000. Preferably o is an integer from 5 to 500, most preferably from 10 to 250.

The molecular weight $M_w$ of the polymeric levelers L3 may be from about 500 to about 400000 g/mol, preferably from about 1000 to about 300000 g/mol, most preferably from about 3000 to about 250000 g/mol. In one particular embodiment the molecular weight $M_w$ is from about 1500 to about 10000 g/mol. In another embodiment the molecular weight $M_w$ is from about 15000 to about 50000 g/mol. In yet another embodiment the molecular weight Mw is from about 100000 to about 300000 g/mol.

In the fourth embodiment the levelers of formula L4Ø is a $C_6$ to $C_{14}$ carbocyclic or a $C_3$ to $C_{10}$ nitrogen or oxygen containing heterocyclic aryl group, which may be unsubstituted or substituted by up to three $C_1$ to $C_{12}$ alkyl groups or up to two OH, $NH_2$ or $NO_2$ groups. Preferably the heterocyclic aryl groups are 5 or 6 membered rings systems with up to 2, preferably 1, N atoms.

Preferred groups Ø are those of formula L4a

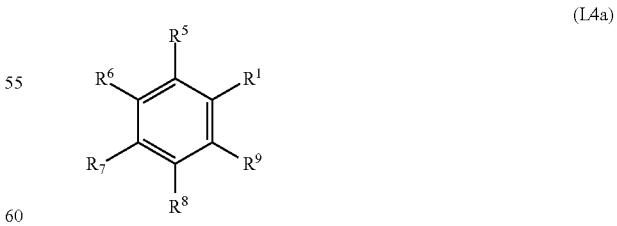

wherein $R^5$, $R^6$, $R^7$, $R^8$, and $R^9$ are independently selected from (i) H and (ii) $C_1$ to $C_6$ alkyl. Preferably $R^5$, $R^6$, $R^8$, and $R^9$ are independently selected from H, methyl, ethyl or propyl, most preferably H. Preferably $R^7$ is selected from H, methyl, ethyl or propyl, most preferably from methyl or ethyl.

In certain embodiments, the leveler may be present at a concentration between about 1-10,000 ppm, or between about 10-1,000 ppm, or between about 10-500 ppm. In some cases, the concentration of leveler may be at least about 1 ppm, or at least about 100 ppm. In these or other cases, the concentration of leveler may be about 500 ppm or less, or about 1000 ppm or less.

In one embodiment a single leveling agent may be used in the cobalt electroplating baths, i.e. the bath is essentially free from any further leveling agent as described in the section below. In another embodiment two or more of the leveling agents are used in combination.

Other levelers often contain one or more nitrogen, amine, imide or imidazole, and may also contain sulfur functional groups. Certain levelers include one or more five and six member rings and/or conjugated organic compound derivatives. Nitrogen groups may form part of the ring structure. In amine-containing levelers, the amines may be primary, secondary or tertiary alkyl amines. Furthermore, the amine may be an aryl amine or a heterocyclic saturated or aromatic amine. Example amines include, but are not limited to, dialkylamines, trialkylamines, arylalkylamines, triazoles, imidazole, triazole, tetrazole, benzimidazole, benzotriazole, piperidine, morpholines, piperazine, pyridine, oxazole, benzoxazole, pyrimidine, quonoline, and isoquinoline. Imidazole and pyridine may be useful in some cases. Other examples of levelers include Janus Green B and Prussian Blue. Leveler compounds may also include ethoxide groups. For example, the leveler may include a general backbone similar to that found in polyethylene glycol or polyethylene oxide, with fragments of amine functionally inserted over the chain (e.g., Janus Green B). Example epoxides include, but are not limited to, epihalohydrins such as epichlorohydrin and epibromohydrin, and polyepoxide compounds. Polyepoxide compounds having two or more epoxide moieties joined together by an ether-containing linkage may be useful in some cases. Some leveler compounds are polymeric, while others are not. Example polymeric leveler compounds include, but are not limited to, polyethylenimine, polyamidoamines, and reaction products of an amine with various oxygen epoxides or sulfides. One example of a non-polymeric leveler is 6-mercapto-hexanol. Another example leveler is polyvinylpyrrolidone (PVP).

Further levelers that may be particularly useful in the context of cobalt are, but are not limited to: alkylated polyalkyleneimines; polyethylene glycol; organic sulfonates; 4-mercaptopyridine; 2-mercaptothiazoline; ethylene thiourea; thiourea; 1-(2-hydroxyethyl)-2-imidazolidinethion; sodium naphthalene 2-sulphonate; acrylamide; substituted amines; imidazole; triazole; tetrazole; piperidine; morpholine; piperazine; pyridine; oxazole; benzoxazole; quinolin; isoquinoline; coumarin and derivatives thereof.

Accelerating Agents

The plating composition may further comprise one or more accelerating agents (also referred to as accelerators), preferably in combination with a suppressing agent.

Example accelerators that may be useful for depositing cobalt include, but are not limited to: N,N-dimethyldithiocarbamic acid (-3-sulfopropyl)ester; 3-mercapto-propylsulfonic acid-(3-sulfurpropyl) ester; 3-sulfanyl-1-propane sulfonate; carbonic acid-dithio-o-ethylester-s-ester with 3-mercapto-1-propane sulfonic acid potassium salt; bis-sulfopropyl disulfide; 3-(benzothiazolyl-s-thio)propyl sulfonic acid sodium salt; pyridinium propyl sulfobetaine; l-sodium-3-mercaptopropane-l-sulfonate; N,N-dimethyl-dithiocarbamic acid-(3-sulfoethyl)ester; 3-mercapto-ethyl propylsulfonic acid (3-sulfoethyl)ester; 3-mercapto-ethyl-sulfonic acid sodium salt; carbonic acid-dithio-o-ethyl esters-s-ester; pyridinium ethyl sulfobetaine; and thiourea. In some cases a combination of these accelerators is used. In a particular embodiment the accelerator is 3-sulfanyl-1-propane sulfonate (commonly referred to as MPS or 3-mercapto-1-propane sulfonic acid sodium salt) and/or thiourea (TU). The accelerator chosen may include, in some cases, a sulfonic acid component and/or an ester component and/or a thiol group.

In some embodiments, the accelerator is present in electrolyte at a concentration between about 1-10,000 ppm, for example between about 150-500 ppm, or between about 150-400 ppm. In some embodiments, the concentration of accelerator is at least about 100 ppm, at least about 150 ppm, at least about 200 ppm, or at least about 300 ppm. In these or other cases, the concentration of accelerator may be about 1,000 ppm or less, or about 500 ppm or less, or about 400 ppm or less. The optimal accelerator concentration may depend on the identity of the accelerator that is used. In various embodiments, the accelerator is MPS and is present in electrolyte at a concentration that meets one or more of the limitations set out in this paragraph. In certain other embodiments, the accelerator is thiourea and is present in electrolyte at a concentration that meets one or more of the limitations set out in this paragraph.

In one embodiment the cobalt electroplating composition is free of any accelerating agent. Preferably the composition is free of any sulfur containing compound.

Other Additives

A large variety of further additives may typically be used in the bath to provide desired surface finishes for the Co plated metal. Usually more than one additive is used with each additive forming a desired function. Advantageously, the electroplating baths may contain one or more of wetting agents or surfactants like Lutensol®, Plurafac® or Pluronic® (available from BASF) to get rid of trapped air or hydrogen bubbles and the like. Further components to be added are grain refiners, stress reducers, levelers and mixtures thereof.

The bath may also contain a complexing agent for the cobalt ions, such as but not limited to sodium acetate, sodium citrate, EDTA, sodium tartrate, or ethylene diamine. Further additives are disclosed in Journal of The Electrochemical Society, 156 (8) D301-D309 2009 "Superconformal Electrodeposition of Co and Co—Fe Alloys Using 2-Mercapto-5-benzimidazolesulfonic Acid", which is incorporated herein by reference.

In a further embodiment, surfactants may be present in the electroplating composition in order to improve wetting. Wetting agents may be selected from nonionic surfactants, anionic surfactants and cationic surfactants.

In a preferred embodiment non-ionic surfactants are used. Typical non-ionic surfactants are fluorinated surfactants, polyglocols, or poly oxyethylene and/or oxypropylene containing molecules.

In a preferred embodiment the cobalt or cobalt alloy electroplating composition consists essentially of cobalt ions (and the respective counter ions and precursors), the ammonium compound, a suppressing agent, a leveling agent, and optionally an acid except boric acid.

Electrolyte

In one embodiment, the usually aqueous plating bath used for void-free filling with cobalt or cobalt alloys may contain a cobalt ion source, such as but not limited to cobalt sulfate, cobalt chloride, or cobalt sulfamate.

The cobalt ion concentration within the electroplating solution may be in a range of 0.01 to 1 mol/l. In one particular example, the ion concentration can have a range of 0.1 to 0.6 mol/l. In another particular example, the range can be from 0.3 to 0.5 mol/l. In yet another particular example, the range can be from 0.03 to 0.1 mol/l.

In a preferred embodiment the composition is essentially free from chloride ions. Essentially free from chloride means that the chloride content is below 1 ppm, particularly below 0.1 ppm.

During deposition, the pH of the plating bath may be adjusted to have a high Faradaic efficiency while avoiding the co-deposition of cobalt hydroxides. For this purpose, a pH range of 1 to 6 may be employed. In a particular example pH range of 2 to 5.5 can be employed. In another particular example, a pH range of 3 to 5.5 can be used. Preferably the pH is below 5, most preferably below 4.

In a preferred embodiment boric acid may be used in the cobalt electroplating bath as supporting electrolyte. Boric acid may be incorporated into the composition in a concentration between about 5 and about 50 g/l, such as between about 15 and about 40 g/l.

The electrodeposition composition is preferably free of nickel ions and iron ions. If either nickel ions or iron ions are present, the molar ratio of both nickel ions and iron ions, and the sum of nickel ions and iron ions, to cobalt ions is preferably not greater than about 0.01, or between about 0.00001 and about 0.01.

The electrodeposition composition is also preferably substantially free of copper ions. Although very minor copper contamination may be difficult to avoid, it is particularly preferred that the copper ion content of the bath is no more than 20 ppb, e.g., in the range of 0.1 ppb to 20 ppb.

The electrodeposition composition is preferably free of any functional concentration of reducing agents effective to reduce cobaltous ion ($Co^{2+}$) to metallic cobalt($Co^0$). By a functional concentration is meant any concentration of an agent that either is effective to reduce cobaltous ions in the absence of electrolytic current or is activated by an electrolytic current or electrolytic field to react with cobaltous ions.

Process

An electrolytic bath is prepared comprising cobalt ions and the at least one additive according to the invention. For interconnects a dielectric substrate having the seed layer is placed into the electrolytic bath where the electrolytic bath contacts the at least one outer surface and the three dimensional pattern having a seed layer in the case of a dielectric substrate. A counter electrode is placed into the electrolytic bath and an electrical current is passed through the electrolytic bath between the seed layer on the substrate and the counter electrode. At least a portion of cobalt is deposited into at least a portion of the three dimensional pattern wherein the deposited cobalt is substantially void-free.

The present invention is useful for depositing a layer comprising cobalt on a variety of substrates, particularly those having micrometer and/or nanometer and particularly variously sized apertures. For example, the present invention is particularly suitable for depositing cobalt on integrated circuit substrates, such as semiconductor devices, with small diameter vias, trenches or other apertures. In one embodiment, semiconductor devices are plated according to the present invention. Such semiconductor devices include, but are not limited to, wafers used in the manufacture of integrated circuits. Furthermore, the present invention is particularly suitable for depositing cobalt for under bump metallization purposes.

In order to allow a deposition on a substrate comprising a dielectric surface a seed layer needs to be applied to the surface. Such seed lay may consist of cobalt, iridium, osmium, palladium, platinum, rhodium, and ruthenium or alloys comprising such metals. Preferred is the deposition on a cobalt seed. The seed layers are described in detail e.g. in US20140183738 A.

The seed layer may be deposited or grown by chemical vapor deposition (CVD). atomic layer deposition (ALD), physical vapor deposition (PVD). Electroplating, electro less plating or other suitable process that deposits conformal thin films. In an embodiment, the cobalt seed layer is deposited to form a high quality conformal layer that sufficiently and evenly covers all exposed surfaces within the openings and top Surfaces. The high quality seed layer may be formed, in one embodiment. by depositing the cobalt seed material at a slow deposition rate to evenly and consistently deposit the conformal seed layer. By forming the seed layer in a conformal manner, compatibility of a subsequently formed fill material with the underlying structure may be improved. Specifically, the seed layer can assist a deposition process by providing appropriate surface energetics for deposition thereon.

Preferably the substrate comprises submicrometer sized features and the cobalt deposition is performed to fill the submicrometer sized features. Most preferably the submicrometer-sized features have an (effective) aperture size of 10 nm or below and/or an aspect ratio of 4 or more. More preferably the features have an aperture size of 7 nanometers or below, most preferably of 5 nanometers or below.

The aperture size according to the present invention means the smallest diameter or free distance of a feature before plating, i.e. after seed deposition. The terms "aperture" and "opening" are used herein synonymously.

The electrodeposition current density should be chosen to promote the void-free, particularly the bottom-up filling behavior. A range of 0.1 to 40 mA/cm$^2$ is useful for this purpose. In a particular example, the current density can range from 1 to 10 mA/cm$^2$. In another particular example, the current density can range from 5 to 15 mA/cm$^2$.

The general requirements for a process of cobalt electrodeposition on semiconductor integrated circuit substrates is described in US 2011/0163449 A1.

Typically, substrates are electroplated by contacting the substrate with the plating baths of the present invention. The substrate typically functions as the cathode. The plating bath contains an anode, which may be soluble or insoluble. Optionally, cathode and anode may be separated by a membrane. Potential is typically applied to the cathode. Sufficient current density is applied and plating performed for a period of time sufficient to deposit a metal layer, such as a cobalt layer, having a desired thickness on the substrate. Suitable current densities include, but are not limited to, the range of 1 to 250 mA/cm$^2$. Typically, the current density is in the range of 1 to 60 mA/cm$^2$ when used to deposit cobalt in the manufacture of integrated circuits. The specific current density depends on the substrate to be plated, the leveling agent selected and the like. Such current density choice is within the abilities of those skilled in the art. The applied current may be a direct current (DC), a pulse current (PC), a pulse reverse current (PRC) or other suitable current.

In general, when the present invention is used to deposit metal on a substrate such as a wafer used in the manufacture of an integrated circuit, the plating baths are agitated during use. Any suitable agitation method may be used with the present invention and such methods are well-known in the art. Suitable agitation methods include, but are not limited to, inert gas or air sparging, work piece agitation, impingement and the like. Such methods are known to those skilled in the art. When the present invention is used to plate an integrated circuit substrate, such as a wafer, the wafer may be rotated such as from 1 to 300 RPM and the plating solution contacts the rotating wafer, such as by pumping or spraying. In the alternative, the wafer need not be rotated where the flow of the plating bath is sufficient to provide the desired metal deposit.

Cobalt is deposited in apertures according to the present invention without substantially forming voids within the metal deposit.

As used herein, void-free fill may either be ensured by an extraordinarily pronounced bottom-up cobalt growth while perfectly suppressing the sidewall cobalt growth, both leading to a flat growth front and thus providing substantially defect free trench/via fill (so-called bottom-up-fill) or may be ensured by a so-called V-shaped filling.

As used herein, the term "substantially void-free", means that at least 95% of the plated apertures are void-free. Preferably that at least 98% of the plated apertures are void-free, mostly preferably all plated apertures are void-free. As used herein, the term "substantially seam-free", means that at least 95% of the plated apertures are void-free. Preferably that at least 98% of the plated apertures are seam-free, mostly preferably all plated apertures are seam-free.

Plating equipment for plating semiconductor substrates are well known. Plating equipment comprises an electroplating tank which holds Co electrolyte and which is made of a suitable material such as plastic or other material inert to the electrolytic plating solution. The tank may be cylindrical, especially for wafer plating. A cathode is horizontally disposed at the upper part of tank and may be any type substrate such as a silicon wafer having openings such as trenches and vias. The wafer substrate is typically coated with a seed layer of Co or other metal or a metal containing layer to initiate plating thereon. An anode is also preferably circular for wafer plating and is horizontally disposed at the lower part of tank forming a space between the anode and cathode. The anode is typically a soluble anode.

These bath additives are useful in combination with membrane technology being developed by various tool manufacturers. In this system, the anode may be isolated from the organic bath additives by a membrane. The purpose of the separation of the anode and the organic bath additives is to minimize the oxidation of the organic bath additives.

The cathode substrate and anode are electrically connected by wiring and, respectively, to a rectifier (power supply). The cathode substrate for direct or pulse current has a net negative charge so that Co ions in the solution are reduced at the cathode substrate forming plated Co metal on the cathode surface. An oxidation reaction takes place at the anode. The cathode and anode may be horizontally or vertically disposed in the tank.

While the process of the present invention has been generally described with reference to semiconductor manufacture, it will be appreciated that the present invention may be useful in any electrolytic process where a substantially void-free cobalt deposit is desired. Such processes include printed wiring board manufacture. For example, the present plating baths may be useful for the plating of vias, pads or traces on a printed wiring board, as well as for bump plating on wafers. Other suitable processes include packaging and interconnect manufacture. Accordingly, suitable substrates include lead frames, interconnects, printed wiring boards, and the like.

All percent, ppm or comparable values refer to the weight with respect to the total weight of the respective composition except where otherwise indicated. All cited documents are incorporated herein by reference.

The following examples shall further illustrate the present invention without restricting the scope of this invention.

EXAMPLES

Experimental Methods

The experiments were performed by using a 300 mm silicon wafer segment with a patterned photoresist 56 µm thick and a plurality of copper seeded 50 micrometer opening vias (available from IMAT, Inc., Vancouver, Wash., USA).

The electroplated cobalt was investigated by a 3D laser scanning microscope (3D LSM). The height of the deposited cobalt layer in the bumps was determined visually.

The non-uniformity was determined from heights of the 82, bumps:
(a) 70 bumps in the dense area at two locations:
  (i) 35 bumps at the center of the dense area with a pitch size of 100 µm and an open bump area of 19.6%, and
  (ii) 35 bumps at the edge of the dense area with a pitch size of 150 µm and an open bump area of 8.7%, and
(b) 12 bumps at the isolated area with a pitch size of 250 µm and an open bump area of 3.1%.

The non-uniformity was calculated from the heights by using the following formula:

$$\text{Non-U}[\%] = \frac{\text{Max} \cdot \text{bump height} - \text{min} \cdot \text{bump height}}{2 * \text{mean height}} \times 100$$

wherein
"Max. bump height" and "min. bump height" are the height of cobalt deposit in the bump with the highest and the lowest deposited cobalt layer, respectively, and "mean height" means the arithmetic average of all heights.

Example 1

Comparative

A cobalt electroplating bath containing 1.02 mol/l $CoSO_4*7H_2O$ in DI water was prepared. The pH of the solution is 5.3.

Cobalt was electroplated from the plating bath onto the wafer by contacting and rotating the substrate at 100 rpm at 25° C. and applying a current of 100 mA/cm² for 360 s.

The non-uniformity of the Co film was 52.2%.

Example 2

Comparative

A cobalt electroplating bath containing 1.02 mol/l $CoSO_4*7H_2O$, 0.49 mol/l $H_3BO_3$, in DI water was prepared. The pH of the solution was 3.9.

Cobalt was electroplated from the plating bath onto the wafer by contacting and rotating the substrate at 100 rpm at 25° C. and applying a current of 100 mA/cm² for 360 s.

The non-uniformity of the Co film was 39.8%. The non-uniformity was only slightly reduced in comparison with comparative example 1.

Example 3

A cobalt electroplating bath containing 1.02 mol/l $CoSO_4*7H_2O$, 0.50 mol/l $NH_4C_1$, in DI water was prepared. The pH of the solution was 4.1.

Cobalt was electroplated from the plating bath onto the wafer by contacting and rotating the substrate at 100 rpm at 25° C. and applying a current of 100 mA/cm² for 360 s.

The non-uniformity of the Co film was 21.6%. By using NH$_4$C$_1$ the non-uniformity was reduced by approx. 60% in relation to comparative example 1 (no additive) and approx. 46% in relation to comparative example 2 (use of boric acid).

Example 4

A cobalt electroplating bath containing 1.02 mol/l CoSO$_4$*7H$_2$O, 0.50 mol/l NH$_4$CH$_3$COO, in Dl water was prepared. The pH of the solution was 5.8.

Cobalt was electroplated from the plating bath onto the wafer by contacting and rotating the substrate at 100 rpm at 25° C. and applying a current of 100 mA/cm² for 360 s.

The non-uniformity of the Co film was 30.2%. By using NH$_4$CH$_3$COO the non-uniformity was reduced by approx. 42% in relation to comparative example 1 (no additive) and approx. 24% in relation to comparative example 2 (use of boric acid).

The invention claimed is:

1. A composition for cobalt electroplating comprising
   (a) a cobalt ion,
   (b) an ammonium compound of formula (NR$^1$R$^2$R$^3$H$^+$)$_n$X$^{n-}$ and
   (c) a suppressing agent of formula S1;

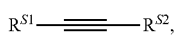
(S1)

wherein
R$^1$, R$^2$, R$^3$ are independently selected from H and linear or branched C$_1$ to C$_6$ alkyl,
X is an n valent inorganic counter ion or n valent organic counter ion selected from the group consisting of chloride, sulfate, hydrogen sulfate, phosphate, hydrogen phosphate, dihydrogen phosphate, nitrate, C$_1$ to C$_6$ alkyl sulfonate, C$_1$ to C$_6$ carboxylates, phosphonate, and sulfamate,
n is an integer selected from 1, 2 or 3,
R$^{S1}$ is X$^S$—Y$^S$,
R$^{S2}$ is R$^{S1}$ or R$^{S3}$;
X$^S$ is linear C$_1$ to C$_{10}$ alkanediyl, branched C$_1$ to C$_{10}$ alkanediyl, linear C$_2$ to C$_{10}$ alkenediyl, branched C$_2$ to C$_{10}$ alkenediyl, linear C$_2$ to C$_{10}$ alkynediyl, branched C$_2$ to C$_{10}$ alkynediyl, or (C$_2$H$_3$R$^{s6}$—O)$_m$—H;
Y$^S$ is OR$^{S3}$, NR$^{S3}$R$^{S4}$, N$^+$R$^{S3}$R$^{S4}$R$^{S5}$, or NH–(C=O)—R$^{S3}$;
R$^{S3}$, R$^{S4}$, and R$^{S5}$ are independently (i) H, (ii) C$_5$ to C$_{20}$ aryl, (iii) C$_1$ to C$_{10}$ alkyl (iv) C$_6$ to C$_{20}$ arylalkyl, (v) C$_6$ to C$_{20}$ alkylaryl optionally substituted by OH, SO$_3$H, COOH, or a combination thereof, or (vi) (C$_2$H$_3$R$^{s6}$—O)$_n$—H, R$^{S3}$ and R$^{S4}$ optionally together forming a ring system optionally interrupted by O or NR$^{S7}$,
m and n are independently integers in a range of from 1 to 30,
R$^{S6}$ is H or C$_1$ to C$_5$ alkyl,
R$^{S7}$ is R$^{S6}$ or

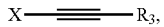

and
wherein the composition is essentially boric acid free;
wherein, if either nickel ions or iron ions are present, the molar ratio of nickel ions and iron ions, and the sum of nickel ions and iron ions, to cobalt ions is not greater than about 0.01; and
wherein the composition is free of any functional concentration of reducing agents effective to reduce cobaltous ion (Co$^{2+}$) to metallic cobalt (Co$^0$).

2. The composition of claim 1, wherein R$^1$, R$^2$, and R$^3$ are independently H, linear C$_1$ to C$_4$ alkyl, or branched C$_1$ to C$_4$ alkyl.

3. The composition of claim 1, wherein at least two of R$^1$, R$^2$ and R$^3$ are H.

4. The composition of claim 1, wherein X is an inorganic counter-ion.

5. A The composition of claim 1, wherein X is chloride.

6. The composition of claim 1, wherein X is an organic counter-ion.

7. The composition of claim 1 wherein the suppressing agent is an aminoalkyne, wherein (i) R$^{S1}$ is X$^S$—NR$^{S3}$R$^{S4}$ and R$^{S2}$ is H; or (ii) R$^{S1}$ is X$^S$—NR$^{S3}$R$^{S4}$ and R$^{S2}$ is X$^S$—NR$^{S3}$R$^{S4}$ and X$^S$ being linear C$_1$ to C$_4$ alkanediyl or branched C$_3$ to C$_6$ alkanediyl.

8. The composition of claim 1, further comprising (d) a leveling agent, or its salt, of formula (L1), (L2), (L3a), (L3b), (L4),

(L1)

(L2)

(L3a)

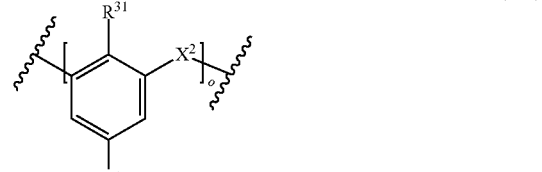
(L3b)

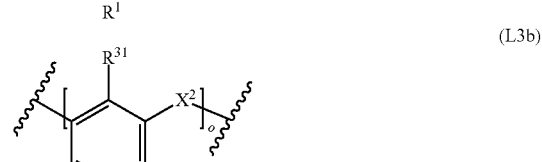

(L4)

wherein
R$^1$ is X$^1$—CO—O—R$^{11}$, X$^1$—SO$_2$—O—R$^{11}$, X$^1$—PO(OR$^{11}$)$_2$, X$^1$—SO—O—$^{11}$;
R$^2$ are independently (i) H, (ii) aryl, (iii) C$_1$ to C$_{10}$ alkyl (iv) arylalkyl, (v) alkylaryl, or (vi) —(O—C$_2$H$_3$R$^{12}$)$_m$—OH,
R$^3$ is R$^1$ or R$^2$;
R$^4$ is R$^2$ or, when R$^3$ is R$^2$, R$^4$ is R$^1$ or R$^2$,
Ø is a C$_6$ to C$_{14}$ carbocyclic or a C$_3$ to C$_{10}$ nitrogen or oxygen containing heterocyclic aryl group, optionally substituted by up to three C$_1$ to C$_{12}$ alkyl groups or up to two OH, NH$_2$, or NO$_2$ groups,
R$^{31}$ is R$^1$, H, OR$^5$, or R$^5$,
X$^1$ is a divalent group which is (i) a chemical bond (ii) aryl, (iii) C$_1$ to C$_{12}$ alkandiyl optionally interrupted by one or more O atoms, (iv) arylalkyl group —$X^{11}$—$X^{12}$—, (v) alkylaryl group —$X^{12}$—$X^{11}$—, or (vi) —$(O$—$C_2H^3R^{12})_m O$—, $X^2$ is (i) a chemical bond or (ii) methanediyl, $R^{11}$ is H or $C_1$ to $C_4$ alkyl, $R^{12}$ is H or $C_1$ to $C_4$ alkyl, $X^{12}$ is a divalent aryl group, $X^{11}$ is a divalent $C_1$ to $C_{15}$ alkandiyl group, A is an optionally be (poly)ethyloxylated vinyl alcohol co-monomer or an acrylamide co-monomer, B is of formula (L1a)

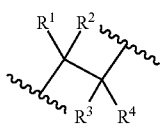
(L1a)

n is an integer in a range of from 2 to 10,000, m is an integer in a range of from 2 to 50, is an integer in a range of from 2 to 1000, and p is 0 or an integer in a range of from 1 to 10,000.

9. The composition of claim 8, wherein the levelling agent (d) comprises polyacrylic acid, a maleic acid acrylic acid copolymer, polyphosphonic acid, polysulfonic acid, acrylic acid, vinylphosphonic acid, vinylsulfonic acid, and/or p-toluol sulfonate.

10. The composition of claim 1, further comprising:
    a suppressing agent comprising a hydroxy alkyne, $C_1$ to $C_6$ alkoxy alkyne or an amino alkyne.

11. The composition of claim 1, wherein $R^1$, $R^2$, and $R^3$ are H.

12. The composition of claim 1, wherein X is chloride, sulfate, hydrogen sulfate, phosphate, hydrogen phosphate, dihydrogen phosphate, or nitrate.

13. The composition of claim 1, wherein X is a $C_1$ to $C_6$ alkyl sulfonate, $C_1$ to $C_6$ carboxylate, organic phosphonate, or organic sulfamate.

14. The composition of claim 1, wherein the suppressing agent is a hydroxyalkyne, wherein (i) $R^{S1}$ is $X^S$—$OR^{S3}$ and $R^{S2}$ is H; or (ii) $R^{S1}$ is $X^S$—$OR^{S3}$ and $R^{S2}$ is $X^s$—$OR^{s3}$ with $X^s$ being linear $C_1$ to $C_4$ alkanediyl or branched $C_3$ to $C_6$ alkanedyl.

15. The composition of claim 1, wherein the suppressing agent is an alkyne comprising an amino and a hydroxy group, wherein $R^{S1}$ is $X^S$—$OR^{S3}$ and $R^{S2}$ is $X^S$—$NR^{S3}R^{S4}$ with $X^S$ being independently linear $C_1$ to $C_4$ alkanediyl or branched $C_3$ to $C_6$ alkanediyl.

16. The composition of claim 1, wherein the suppressing agent is an alkyne comprising an amino and a hydroxy group, wherein $R^{S1}$ is $X^S$—OH and $R^{S2}$ is $X^S$—$NR^{S3}R^{S4}$ with $X^S$ being independently linear $C^1$ to $C^4$ alkanediyl or branched $C^3$ to $C^6$ alkanediyl.

17. A process for depositing cobalt into interconnect features or for providing a cobalt under bump metallization, the process comprising brining the composition of claim 1 and the interconnect features and/or a substrate into proximity so as to enable the depositing and/or bump metallization.

18. A process for depositing cobalt on a semiconductor substrate comprising a recessed feature having an aperture size of 1 nanometer to 100 micrometers, the process comprising:
    (a) contacting the composition of claim 1 with the semiconductor substrate;
    (b) applying a potential for a time sufficient to fill the recessed feature with cobalt.

* * * * *